United States Patent
Yang et al.

(10) Patent No.: US 7,780,793 B2
(45) Date of Patent: Aug. 24, 2010

(54) PASSIVATION LAYER FORMATION BY PLASMA CLEAN PROCESS TO REDUCE NATIVE OXIDE GROWTH

(75) Inventors: Haichun Yang, Santa Clara, CA (US); Xinliang Lu, Fremont, CA (US); Chien-Teh Kao, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

(21) Appl. No.: 11/962,791

(22) Filed: Dec. 21, 2007

(65) Prior Publication Data

US 2008/0160210 A1    Jul. 3, 2008

Related U.S. Application Data

(60) Continuation-in-part of application No. 11/622,437, filed on Jan. 11, 2007, which is a continuation-in-part of application No. 11/137,609, filed on May 24, 2005, now Pat. No. 7,396,480, which is a division of application No. 11/063,645, filed on Feb. 22, 2005.

(60) Provisional application No. 60/547,839, filed on Feb. 26, 2004.

(51) Int. Cl.
*B08B 6/00* (2006.01)
(52) U.S. Cl. .............................. 134/1.2; 134/19; 134/31
(58) Field of Classification Search ........................ None
See application file for complete search history.

(56) References Cited

U.S. PATENT DOCUMENTS 4,209,357 A    6/1980    Gorin et al.

(Continued)

FOREIGN PATENT DOCUMENTS

CN    1375575    10/2002

(Continued)

OTHER PUBLICATIONS

PCT International Search Report and Written Opinion dated Jun. 23, 2009 for International Application No. PCT/US2008/087436.

(Continued)

*Primary Examiner*—Michael Kornakov
*Assistant Examiner*—Ryan Coleman
(74) *Attorney, Agent, or Firm*—Patterson & Sheridan, LLP

(57) ABSTRACT

Embodiments described herein provide methods for removing native oxide surfaces on substrates while simultaneously passivating the underlying substrate surface. In one embodiment, a method is provided which includes positioning a substrate containing an oxide layer within a processing chamber, adjusting a first temperature of the substrate to about 80° C. or less, generating a cleaning plasma from a gas mixture within the processing chamber, such that the gas mixture contains ammonia and nitrogen trifluoride having an $NH_3/NF_3$ molar ratio of about 10 or greater, and condensing the cleaning plasma onto the substrate. A thin film, containing ammonium hexafluorosilicate, is formed in part, from the native oxide during a plasma clean process. The method further includes heating the substrate to a second temperature of about 100° C. or greater within the processing chamber while removing the thin film from the substrate and forming a passivation surface thereon.

24 Claims, 10 Drawing Sheets

U.S. PATENT DOCUMENTS

| | | | |
|---|---|---|---|
| 4,565,601 A | 1/1986 | Kakehi et al. | |
| 4,579,618 A | 4/1986 | Celestino et al. | |
| 4,585,920 A | 4/1986 | Hoog et al. | |
| 4,807,016 A * | 2/1989 | Douglas | 257/774 |
| 4,872,947 A | 10/1989 | Wang et al. | |
| 4,886,570 A | 12/1989 | Davis et al. | |
| 4,892,753 A | 1/1990 | Wang et al. | |
| 4,951,601 A | 8/1990 | Maydan et al. | |
| 4,985,372 A | 1/1991 | Narita et al. | |
| 5,000,113 A | 3/1991 | Wang et al. | |
| 5,030,319 A | 7/1991 | Nishino et al. | |
| 5,089,441 A | 2/1992 | Moslehi | |
| 5,186,718 A | 2/1993 | Tepman et al. | |
| 5,198,034 A | 3/1993 | deBoer et al. | |
| 5,228,501 A | 7/1993 | Tepman et al. | |
| 5,231,690 A | 7/1993 | Soma et al. | |
| 5,238,499 A | 8/1993 | van de Ven et al. | |
| 5,282,925 A * | 2/1994 | Jeng et al. | 216/59 |
| 5,328,558 A | 7/1994 | Kawamura et al. | |
| 5,345,999 A | 9/1994 | Hosokawa | |
| 5,352,636 A | 10/1994 | Beinglass | |
| 5,368,897 A | 11/1994 | Kurihara et al. | |
| 5,382,311 A | 1/1995 | Ishikawa et al. | |
| 5,403,434 A | 4/1995 | Moslehi | |
| 5,451,259 A | 9/1995 | Krogh | |
| 5,500,249 A | 3/1996 | Telford et al. | |
| 5,505,816 A | 4/1996 | Barnes et al. | |
| 5,516,367 A | 5/1996 | Lei et al. | |
| 5,531,835 A | 7/1996 | Fodor et al. | |
| 5,549,780 A | 8/1996 | Koinuma et al. | |
| 5,560,779 A | 10/1996 | Knowles et al. | |
| 5,578,130 A | 11/1996 | Hayashi et al. | |
| 5,683,517 A * | 11/1997 | Shan | 118/723 E |
| 5,716,500 A | 2/1998 | Bardos et al. | |
| 5,716,506 A | 2/1998 | Maclay et al. | |
| 5,800,686 A | 9/1998 | Littau et al. | |
| 5,812,403 A | 9/1998 | Fong et al. | |
| 5,844,195 A | 12/1998 | Fairbairn et al. | |
| 5,846,332 A | 12/1998 | Zhao et al. | |
| 5,846,375 A | 12/1998 | Gilchrist et al. | |
| 5,855,681 A | 1/1999 | Maydan et al. | |
| 5,856,240 A | 1/1999 | Sinha et al. | |
| 5,885,404 A | 3/1999 | Kim et al. | |
| 5,899,752 A | 5/1999 | Hey et al. | |
| 5,942,075 A | 8/1999 | Nagahata et al. | |
| 5,951,601 A | 9/1999 | Lesinski et al. | |
| 5,951,776 A | 9/1999 | Selyutin et al. | |
| 5,993,916 A | 11/1999 | Zhao et al. | |
| 6,035,101 A | 3/2000 | Sajoto et al. | |
| 6,083,344 A | 7/2000 | Hanawa et al. | |
| 6,086,677 A | 7/2000 | Umotoy et al. | |
| 6,176,198 B1 | 1/2001 | Kao et al. | |
| 6,177,245 B1 | 1/2001 | Ward et al. | |
| 6,179,924 B1 | 1/2001 | Zhao et al. | |
| 6,197,116 B1 * | 3/2001 | Kosugi | 118/712 |
| 6,238,513 B1 | 5/2001 | Arnold et al. | |
| 6,241,845 B1 | 6/2001 | Gadgil et al. | |
| 6,284,048 B1 * | 9/2001 | Van Bilsen et al. | 118/666 |
| 6,350,320 B1 | 2/2002 | Sherstinsky et al. | |
| 6,364,949 B1 | 4/2002 | Or et al. | |
| 6,364,954 B2 | 4/2002 | Umotoy et al. | |
| 6,364,957 B1 | 4/2002 | Schneider et al. | |
| 6,372,657 B1 | 4/2002 | Hineman et al. | |
| 6,446,572 B1 | 9/2002 | Brcka | |
| 6,448,537 B1 | 9/2002 | Nering | |
| 6,494,959 B1 | 12/2002 | Samoilov et al. | |
| 6,500,728 B1 | 12/2002 | Wang et al. | |
| 6,506,291 B2 | 1/2003 | Tsai et al. | |
| 6,544,340 B2 | 4/2003 | Yudovsky | |
| 6,603,269 B1 | 8/2003 | Vo et al. | |
| 6,635,185 B2 | 10/2003 | Demmin et al. | |
| 6,638,810 B2 | 10/2003 | Bakli et al. | |
| 6,645,301 B2 | 11/2003 | Sainty et al. | |
| 6,656,831 B1 | 12/2003 | Lee et al. | |
| 6,670,278 B2 | 12/2003 | Li et al. | |
| 6,679,981 B1 | 1/2004 | Pan et al. | |
| 6,740,585 B2 | 5/2004 | Yoon et al. | |
| 6,800,830 B2 | 10/2004 | Mahawili | |
| 6,808,564 B2 | 10/2004 | Dietze | |
| 6,878,206 B2 | 4/2005 | Tzu et al. | |
| 6,879,981 B2 | 4/2005 | Rothschild et al. | |
| 6,911,401 B2 | 6/2005 | Khandan et al. | |
| 6,958,286 B2 | 10/2005 | Chen et al. | |
| 6,960,781 B2 | 11/2005 | Currie et al. | |
| 7,049,200 B2 | 3/2006 | Arghavani et al. | |
| 7,122,949 B2 | 10/2006 | Strikovski | |
| 7,253,123 B2 | 8/2007 | Arghavani et al. | |
| 7,256,370 B2 | 8/2007 | Guiver | |
| 7,396,480 B2 | 7/2008 | Kao et al. | |
| 2001/0015261 A1 | 8/2001 | Kobayashi et al. | |
| 2002/0011210 A1 | 1/2002 | Satoh et al. | |
| 2002/0029747 A1 | 3/2002 | Powell et al. | |
| 2002/0033233 A1 | 3/2002 | Savas | |
| 2003/0019428 A1 | 1/2003 | Ku et al. | |
| 2003/0029566 A1 | 2/2003 | Roth | |
| 2003/0038127 A1 | 2/2003 | Liu et al. | |
| 2003/0072639 A1 | 4/2003 | White et al. | |
| 2003/0079686 A1 | 5/2003 | Chen et al. | |
| 2003/0098125 A1 | 5/2003 | An | |
| 2003/0116087 A1 | 6/2003 | Nguyen et al. | |
| 2003/0129106 A1 | 7/2003 | Sorensen et al. | |
| 2003/0132319 A1 | 7/2003 | Hytros et al. | |
| 2003/0173347 A1 | 9/2003 | Guiver | |
| 2003/0221780 A1 | 12/2003 | Lei et al. | |
| 2003/0227013 A1 | 12/2003 | Currie et al. | |
| 2004/0005726 A1 | 1/2004 | Huang | |
| 2004/0069225 A1 | 4/2004 | Fairbairn et al. | |
| 2004/0070346 A1 | 4/2004 | Choi | |
| 2004/0182315 A1 | 9/2004 | Laflamme et al. | |
| 2004/0194799 A1 | 10/2004 | Kim et al. | |
| 2004/0219789 A1 | 11/2004 | Wood et al. | |
| 2005/0205110 A1 | 9/2005 | Kao et al. | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2006/0051968 A1 | 3/2006 | Joshi et al. | |
| 2006/0130971 A1 | 6/2006 | Chang et al. | |
| 2006/0185592 A1 | 8/2006 | Matsuura | |
| 2007/0087573 A1 | 4/2007 | Chiang et al. | |
| 2008/0160210 A1 | 7/2008 | Yang et al. | |

FOREIGN PATENT DOCUMENTS

| | | |
|---|---|---|
| CN | 1 822 328 | 8/2006 |
| EP | 0 376 252 | 7/1990 |
| EP | 0 658 928 | 10/1994 |
| EP | 1099776 A1 | 11/2000 |
| EP | 1107288 | 6/2001 |
| EP | 1 568 797 | 8/2005 |
| JP | 02256235 | 10/1990 |
| JP | 10154699 | 6/1998 |
| JP | 2000-208498 | 7/2000 |
| JP | 2001-053055 | 2/2001 |
| JP | 2002100578 | 4/2002 |
| JP | 2003019433 | 1/2003 |
| JP | 2003059914 | 2/2003 |
| JP | 2003-133284 | 5/2003 |
| JP | 2003217898 | 7/2003 |
| KR | 10-0593740 | 6/2006 |
| WO | WO-2004006303 | 1/2004 |
| WO | WO-2004074932 | 9/2004 |

OTHER PUBLICATIONS

Prosecution History for U.S. Appl. No. 11/622,437.
Notification of First Office Action dated Mar. 20, 2009 for Chinese Patent Application No. 2008100007537.
International Search Report and Written Opinion of the International Searching Authority mailed Jul. 3, 2008 (PCT/US05/46226;).
Ogawa, Hiroki, et al.; Dry Cleaning Technology for Removal of Silicon Native Oxide Employing Hot $NH_3/NF_3$ Exposure, Jpn. J. Appl. Phys. vol. 41 (2002) pp. 5349-5358, Part 1, No. 8, Aug. 2002.
H. Nishino, N. Hayasaka, and H. Okano, Damage-Free Selective Etching of SI Native Oxides Using $NH_3/NF_3$ and $SF_6/H_2O$ Down-Flow Etching, The Japanese Society of Applied Physics, vol. 74, No. 2, pp. 1345-1348, XP-002491959, Jul. 15, 1993.
EP Partial Search Report, Application No. 08150111.6-1235 / 1944796, dated Aug. 22, 2008.
Wang et al.; Ultra High-selectivity silicon nitride etch process using an inductively coupled plasma source; J. Vac. Sci. Technol. A 16(3),May/Jun. 1998, pp. 1582-1587.
Hashim et al.; Characterization of thin oxide removal by RTA Treatment; ICSE 1998 Proc. Nov. 1998, Rangi, Malaysia, pp. 213-216.
Wolf et al.; Silicon Processing for the VLSI Era; vol. 1; 1986; Lattice Press, pp. 546, 547, 618, 619.
European Search Report dated May 23, 2006 for EP Application No. 05251143.3.
European Search Report dated Sep. 1, 2006 for EP Application No. 05251143.3.
S.M. Sze, VLSI Technology, McGraw-Hill Book Company, pp. 107, 108.
First Office Action dated Sep. 7, 2007 for Chinese Patent Application No. 2005100565328.
European Examination Report dated Nov. 13, 2007 for EP Application No. 05251143.3.

* cited by examiner

PASSIVATION LAYER FORMATION BY PLASMA CLEAN PROCESS TO REDUCE NATIVE OXIDE GROWTH

CROSS-REFERENCE TO RELATED APPLICATIONS

This application is a continuation-in-part of U.S. Ser. No. 11/622,437, filed Jan. 11, 2007, which is a continuation-in-part of U.S. Ser. No. 11/137,609, filed May 24, 2005, now issued as U.S. Pat. No. 7,396,480, which is a divisional of U.S. Ser. No. 11/063,645, filed Feb. 22, 2005, which claims benefit of U.S. Ser. No. 60/547,839, filed Feb. 26, 2004, which are all herein incorporated by reference in their entirety. This application is also related to U.S. patent application Ser. No. 11/137,199, filed May 24, 2005; U.S. patent application Ser. No. 11/266,167, filed Nov. 3, 2005; and U.S. patent application Ser. No. 12/134,715, filed Jun. 6, 2008.

BACKGROUND OF THE INVENTION

1. Field of the Invention

Embodiments of the invention generally relate to methods for processing substrates, and more particularly, to methods for oxide etching during plasma clean processes.

2. Description of the Related Art

In semiconductor, display, solar, and other electronics fabrication, a native oxide typically forms when a substrate surface is exposed to oxygen and water in the air. Oxygen exposure occurs when substrates are moved between processing chambers at atmospheric or ambient conditions, or when a small amount of oxygen remains in a processing chamber. Native oxides may also result from contamination during etching process. Native oxide films are usually very thin, such as between 5-20 Å, but thick enough to cause difficulties in subsequent fabrication processes. Therefore, a native oxide layer is typically undesirable and needs to be removed prior to a subsequent fabrication process.

Such difficulties usually affect the electrical properties of electronic devices formed on the substrate. For example, a particular problem arises when native silicon oxide films are formed on exposed silicon containing layers, especially during processing of metal oxide silicon field effect transistor ("MOSFET") structures. Silicon oxide films are electrically insulating and are undesirable at interfaces with contact electrodes or interconnecting electrical pathways because they cause high electrical contact resistance. In MOSFET structures, the electrodes and interconnecting pathways include silicide layers formed by depositing a refractory metal on bare silicon and annealing the layer to produce the metal silicide layer. Native silicon oxide films at the interface between the substrate and the metal reduce the compositional uniformity of the silicide layer by impeding the diffusional chemical reaction that forms the metal silicide. This results in lower substrate yields and increased failure rates due to overheating at the electrical contacts. The native silicon oxide film can also prevent adhesion of other CVD or sputtered layers which are subsequently deposited on the substrate.

Sputter etch processes have been used to reduce contaminants in large features or in small features having aspect ratios smaller than about 4:1. However, sputter etch processes can damage delicate silicon layers by physical bombardment. In response, wet etch processes utilizing hydrofluoric acid have also been used to remove native oxides. However, wet clean etch processes are disadvantageous in smaller devices where the aspect ratio exceeds 4:1, and especially where the aspect ratio exceeds 10:1. Particularly, the aqueous solution has difficulty penetrating into vias, contacts, or other small features formed within the substrate surface. As a result, the removal of the native oxide film is incomplete. Similarly, a wet etch solution, if successful in penetrating a small feature, is even more difficult to remove from the feature once etching is complete. Also, wet etch processes usually have strict queue time control, create undesirable watermarks on the substrate, and have environmental concerns due to the large amount of hazardous liquid waste.

Another approach for eliminating native oxide films is a dry etch process, such as one utilizing fluorine ($F_2$) gas. One disadvantage to using fluorine-containing gases, however, is that fluorine is typically left behind on the substrate surface. Fluorine atoms or fluorine radicals left behind on the substrate surface can be detrimental. For example, the fluorine atoms left behind can continue to etch the substrate causing voids therein.

A more recent approach to remove native oxide films has been to form a fluorine/silicon-containing salt on the substrate surface that is subsequently removed by a thermal annealing process. In this approach, a thin layer of the salt is formed by reacting a fluorine-containing gas with the silicon oxide surface. The salt is then heated to an elevated temperature sufficient to decompose the salt into volatile by-products which are then removed from the processing chamber. The formation of a reactive fluorine-containing gas is usually assisted by thermal addition or by plasma energy. The salt is usually formed at a reduced temperature that requires cooling of the substrate surface. This sequence of cooling followed by heating is accomplished by transferring the substrate from a cooling chamber where the substrate is cooled to a separate anneal chamber or furnace where the substrate is heated.

For various reasons, this reactive fluorine processing sequence is not desirable. Namely, throughput is greatly diminished because of the time involved to transfer the substrate. Also, the substrate is highly susceptible to further oxidation or other contamination during the transfer between chambers. Moreover, the cost of ownership is doubled because two separate chambers are needed to complete the oxide removal process.

Therefore, there is a need for a method to remove or etch native oxides while passivating the underlying substrate surface, preferably, within a single processing chamber.

SUMMARY OF THE INVENTION

Embodiments described herein provide methods for removing native oxide surfaces on substrates while simultaneously passivating the underlying substrate surface. In one embodiment, a method for removing native oxides from a substrate surface is provided which includes positioning a substrate containing an oxide layer on the substrate surface within a processing chamber, adjusting a first temperature of the substrate to about 80° C. or less, generating a cleaning plasma from a gas mixture within the processing chamber, such that the gas mixture contains ammonia and nitrogen trifluoride having an $NH_3/NF_3$ molar ratio of about 10 or greater, and condensing the cleaning plasma onto the substrate and forming a thin film during a plasma clean process. The thin film contains ammonium hexafluorosilicate formed in part from the silicon of the native, silicon oxide layer. The method further includes heating the substrate to a second temperature of about 100° C. or greater within the processing chamber while removing the thin film from the substrate and forming a passivation surface thereon. In one example, the first temperature of the substrate is within a range from about 20° C. to about 80° C. and the second temperature of the substrate is within a range from about 100° C. to about 200° C. In another example, the first temperature of the substrate is within a range from about 22° C. to about 40° C. and the second temperature of the substrate is within a range from about 110° C. to about 150° C.

In another embodiment, a method for removing native oxides from a substrate surface is provided which includes positioning a substrate containing an oxide layer on the substrate surface within a processing chamber, adjusting a first temperature of the substrate to less than about 100° C., generating a cleaning plasma from a gas mixture within the processing chamber. The gas mixture contains ammonia and nitrogen trifluoride having an $NH_3/NF_3$ molar ratio of about 20 or greater and the cleaning plasma is generated by a RF power within a range from about 5 watts to about 50 watts. The method further provides exposing the substrate to the cleaning plasma to form a thin film containing ammonium hexafluorosilicate during a plasma clean process. The method further includes heating the substrate to a second temperature of about 100° C. or greater within the processing chamber, while removing the thin film from the substrate and forming a passivation surface thereon.

In another embodiment, a method for removing native oxides from a substrate surface is provided which includes positioning a substrate containing an oxide layer on the substrate surface within a processing chamber, adjusting a first temperature of the substrate to less than about 100° C., generating a cleaning plasma from a gas mixture within the processing chamber. The gas mixture contains ammonia and nitrogen trifluoride having an $NH_3/NF_3$ molar ratio of about 10 or greater and the cleaning plasma is generated by a RF power within a range from about 5 watts to about 50 watts. The method further provides exposing the substrate to the cleaning plasma to form a thin film during a plasma clean process, wherein the thin film contains ammonium hexafluorosilicate formed in part from the silicon oxide layer, heating the substrate to a second temperature of about 100° C. or greater within the processing chamber, while removing the thin film from the substrate and forming a passivation surface thereon, and growing an epitaxial layer on the passivation surface of the substrate.

Embodiments of the invention provide that the $NH_3/NF_3$ molar ratio may be about 10, about 15, about 20, or greater, while the cleaning plasma may be generated by a RF power within a range from about 5 watts to about 50 watts, preferably, from about 15 watts to about 30 watts. The gas mixtures are formed by flowing and combining ammonia and nitrogen trifluoride into the processing chamber. The ammonia may have a flow rate within a range from about 20 sccm to about 300 sccm, preferably, from about 40 sccm to about 200 sccm, more preferably, from about 60 sccm to about 150 sccm, and more preferably, from about 75 sccm to about 100 sccm. The nitrogen trifluoride may have a flow rate within a range from about 1 sccm to about 60 sccm, preferably, from about 2 sccm to about 50 sccm, more preferably, from about 3 sccm to about 25 sccm, and more preferably, from about 5 sccm to about 15 sccm.

The passivated surface limits further formation of additional native oxide growth on the substrate upon subsequent exposure to ambient conditions outside the processing chamber. For example, a later native oxide layer may be formed with a thickness of about 6 Å or less during a queue time period within a range from about 5 hours to about 25 hours while in an ambient environment. In another example, a later native oxide layer may be formed with a thickness of about 8 Å or less during a queue time period within a range from about 15 hours to about 30 hours while in an ambient environment. In another embodiment, an epitaxial layer may be grown over the passivated surface of the substrate subsequent to removal of the native oxide layer.

BRIEF DESCRIPTION OF THE DRAWINGS

So that the manner in which the above recited features of the invention may be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
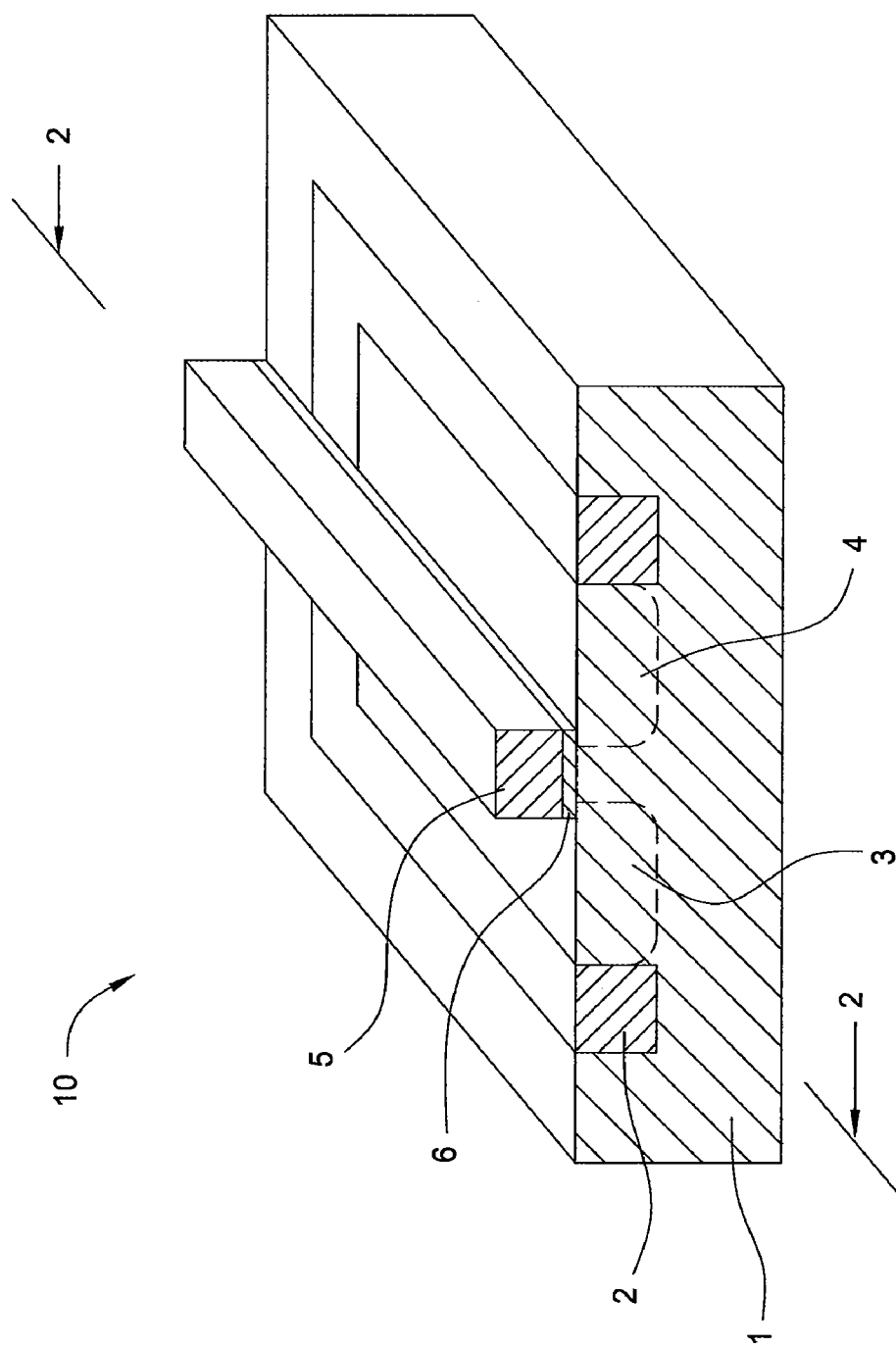
FIG. 1 schematically illustrates a partial perspective view of a substrate block having a shallow trench isolation formed therein, as described in an embodiment herein.

FIG. 1 schematically illustrates a partial perspective view of substrate 10 having a shallow trench isolation formed therein. Substrate 10 shown is only partially fabricated and has shallow trench 2 formed in silicon layer 1. Silicon layer 1 may be a silicon-containing underlayer or may be the actual underlying substrate. Shallow trench 2 is filled with oxides and is configured to isolate an electronic device, in this case, a transistor, built within. Source 3 and drain 4 may be formed within shallow trench 2 by implanting dopants therein. Polycrystalline silicon 5 is disposed between source 3 and drain 4, while gate oxide layer 6 is disposed between the silicon layer 1 and polycrystalline silicon 5.

Figure 2:
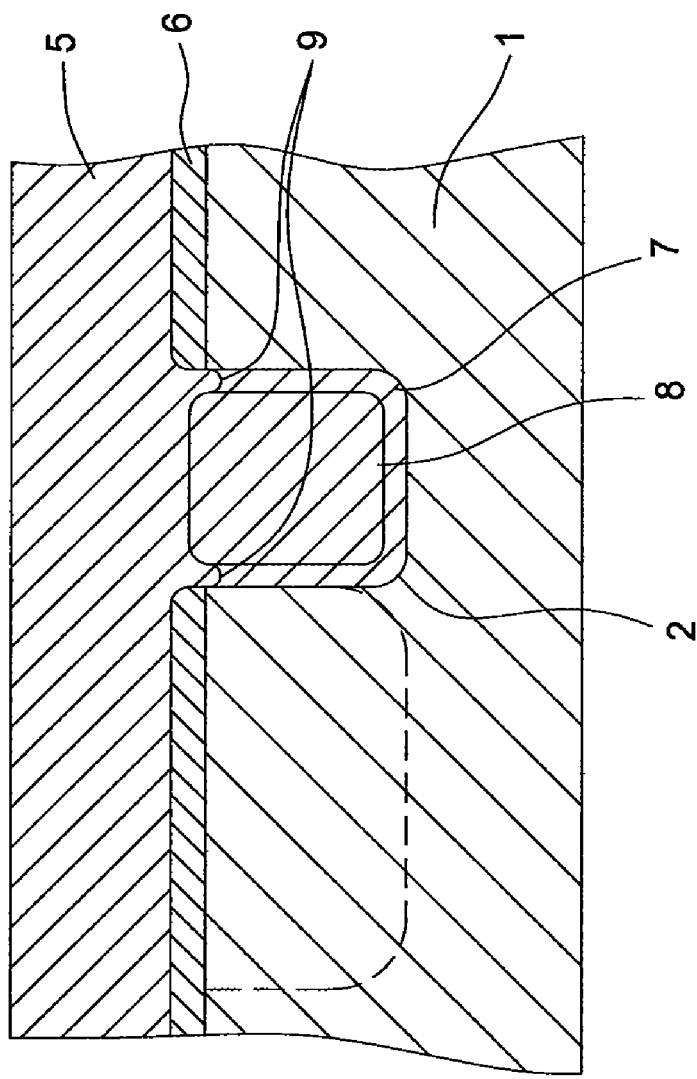
FIG. 2 schematically illustrates a partial view of a shallow trench isolation, as described in an embodiment herein.

FIG. 2 schematically illustrates a partial sectional view of substrate 10 along section line 2-2. FIG. 2 illustrates where polycrystalline silicon 5 contacts shallow trench 2. Shallow trench 2 is formed by thermal oxide layer 7 and a deposited oxide layer 8. The pre-poly etch/clean step is performed by a wet etching process utilizing HF. Gap 9 is formed in shallow trench 2 since the HF etches thermal oxide layer 7 at a faster rate that deposited oxide layer 8. The subsequence poly deposition results in polycrystalline silicon 5 filling in the gap 9 and wrapping around source 3 or drain 4, causing parasitic junctions or leakages.

Figure 3:
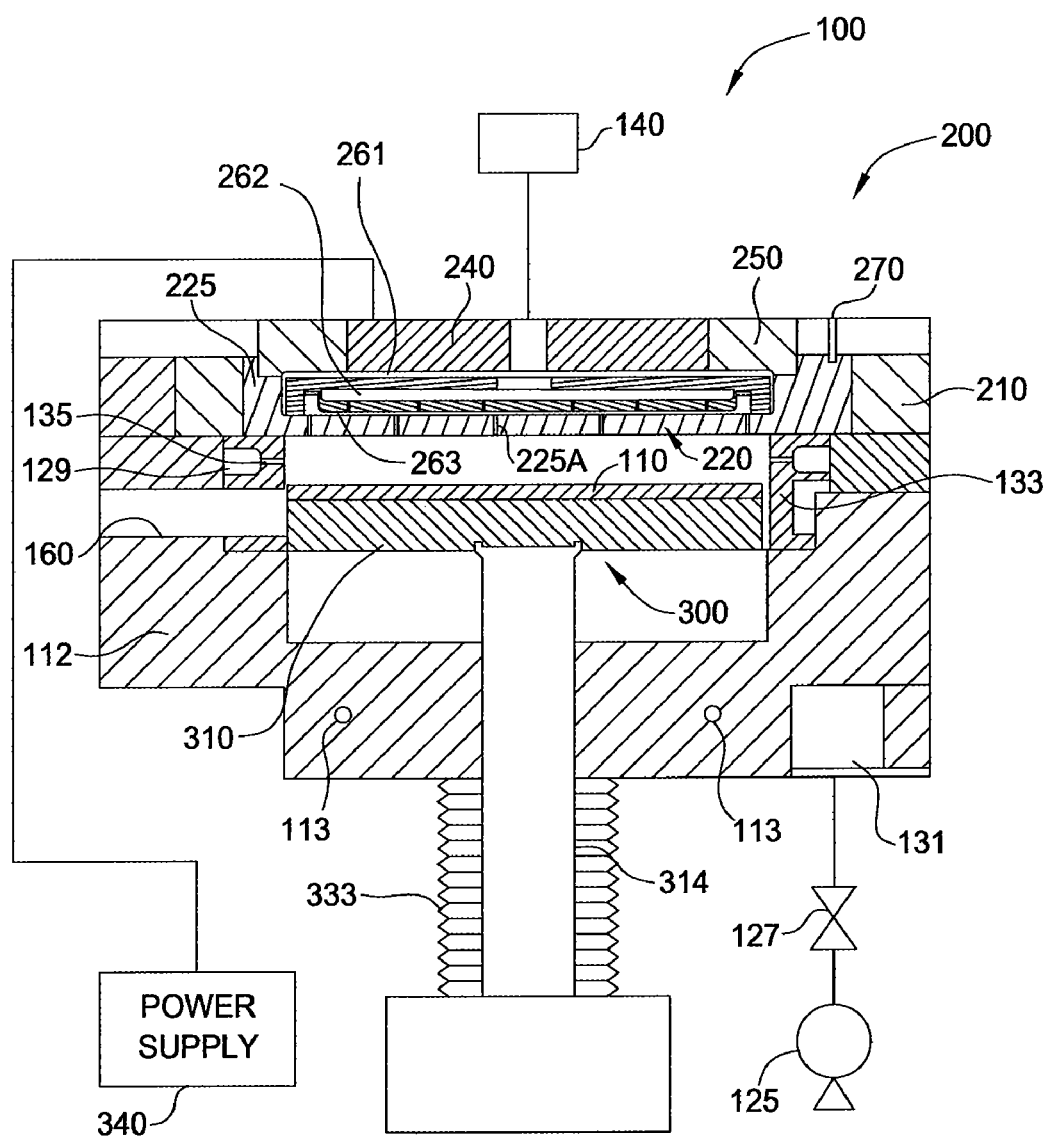
FIG. 3 schematically illustrates a sectional view of a processing chamber in accordance with an embodiment described herein.

FIG. 3 schematically illustrates a sectional view of processing chamber 100 in accordance with one embodiment of the present invention. In this embodiment, processing chamber 100 includes lid assembly 200 disposed at an upper end of chamber body 112, and support assembly 300 at least partially disposed within chamber body 112. The processing chamber also includes remote plasma generator 140 having a remote electrode with a U-shaped cross section. Processing chamber 100 and the associated hardware are preferably formed from one or more process-compatible materials, for example, aluminum, anodized aluminum, nickel plated aluminum, nickel plated aluminum 6061-T6, stainless steel, as well as combinations and alloys thereof.

Support assembly 300 is partially disposed within chamber body 112. Support assembly 300 is raised and lowered by shaft 314 which is enclosed by bellows 333. Chamber body 112 includes slit valve opening 160 formed in a sidewall thereof to provide access to the interior of processing chamber 100. Slit valve opening 160 is selectively opened and closed to allow access to the interior of chamber body 112 by a substrate handling robot (not shown). In one embodiment, a substrate may be transported in and out of processing chamber 100 through slit valve opening 160 to an adjacent transfer chamber and/or load-lock chamber (not shown), or another chamber within a cluster tool. Illustrative cluster tools include but are not limited to the PRODUCER®, CENTURA®, ENDURA®, and ENDURA® SL platforms, available from Applied Materials, Inc., located in Santa Clara, Calif.

Chamber body 112 also includes channel 113 formed therein for flowing a heat transfer fluid therethrough. The heat transfer fluid may be a heating fluid or a coolant and is used to control the temperature of chamber body 112 during processing and substrate transfer. The temperature of chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

Chamber body 112 further includes a liner 133 that surrounds support assembly 300, and is removable for servicing and cleaning. Liner 133 is preferably made of a metal such as aluminum, or a ceramic material. However, other materials which are compatible may be used during the process. Liner 133 may be bead blasted to increase the adhesion of any material deposited thereon, thereby preventing flaking of material which results in contamination of processing chamber 100. Liner 133 typically includes one or more apertures 135 and a pumping channel 129 formed therein that is in fluid communication with a vacuum system. Apertures 135 provide a flow path for gases into pumping channel 129, and the pumping channel provides a flow path through liner 133 so the gases can exit processing chamber 100.

The vacuum system may comprise vacuum pump 125 and throttle valve 127 to regulate flow of gases within processing chamber 100. Vacuum pump 125 is coupled to a vacuum port 131 disposed on chamber body 112, and is in fluid communication with pumping channel 129 formed within liner 133. Vacuum pump 125 and chamber body 112 are selectively isolated by throttle valve 127 to regulate flow of the gases within processing chamber 100. The terms "gas" and "gases" may be used interchangeably, unless otherwise noted, and refer to one or more precursors, reactants, catalysts, carrier, purge, cleaning, combinations thereof, as well as any other fluid introduced into chamber body 112.

Lid assembly 200 contains a number of components stacked together. For example, lid assembly 200 contains a lid rim 210, gas delivery assembly 220, and top plate 250. Lid rim 210 is designed to hold the weight of the components making up lid assembly 200 and is coupled to an upper surface of chamber body 112 to provide access to the internal chamber components. Gas delivery assembly 220 is coupled to an upper surface of lid rim 210 and is arranged to make minimum thermal contact therewith. The components of lid assembly 200 are preferably constructed of a material having a high thermal conductivity and low thermal resistance, such as an aluminum alloy with a highly finished surface, for example. Preferably, the thermal resistance of the components is less than about $5 \times 10^{-4}$ m² K/W.

Gas delivery assembly 220 may comprise a gas distribution plate 225 or showerhead. A gas supply panel (not shown) is typically used to provide the one or more gases to processing chamber 100. The particular gas or gases that are used depend upon the process to be performed within processing chamber 100. For example, the typical gases include one or more precursors, reductants, catalysts, carriers, purge, cleaning, or any mixture or combination thereof. Typically, the one or more gases are introduced to processing chamber 100 into lid assembly 200 and then into chamber body 112 through gas delivery assembly 220. An electronically operated valve and/or flow control mechanism (not shown) may be used to control the flow of gas from the gas supply into processing chamber 100.

In one aspect, the gas is delivered from the gas supply panel to processing chamber 100 where the gas line tees into two separate gas lines which feed gases to chamber body 112 as described above. Depending on the process, any number of gases may be delivered in this manner and may be mixed either in processing chamber 100 or before they are delivered to processing chamber 100.

Still referring to FIG. 3, lid assembly 200 may further include electrode 240 to generate a plasma of reactive species within lid assembly 200. In this embodiment, electrode 240 is supported on top plate 250 and is electrically isolated therefrom. An isolator filler ring (not shown) is disposed about a lower portion of electrode 240 separating electrode 240 from top plate 250. An annular isolator (not shown) is disposed about an upper portion of the isolator filler ring and rests on an upper surface of top plate 250, as shown in FIG. 3. An annular insulator (not shown) is then disposed about an upper portion of electrode 240 so that electrode 240 is electrically isolated from the other components of lid assembly 200. Each of these rings, the isolator filler and annular isolators may be made from aluminum oxide or any other electrically insulating, process compatible material.

Electrode 240 is coupled to a power source 340 while gas delivery assembly 220 is connected to ground. Accordingly, a plasma of the one or more process gases is struck in the volume formed between electrode 240 and gas delivery assembly 220. The plasma may also be contained within the volumes formed by blocker plates. In the absence of a blocker plate assembly, the plasma is struck and contained between electrode 240 and gas delivery assembly 220. In either embodiment, the plasma is well confined or contained within lid assembly 200.

Any power source capable of activating the gases into reactive species and maintaining the plasma of reactive species may be used. For example, radio frequency (RF), direct current (DC), alternating current (AC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into processing chamber 100. Exemplary remote plasma generators are available from vendors such as MKS Instruments, Inc., and Advanced Energy Industries, Inc. Preferably, an RF power supply is coupled to electrode 240.

Gas delivery assembly 220 may be heated depending on the process gases and operations to be performed within processing chamber 100. In one embodiment, heating element 270, such as a resistive heater for example, is coupled to gas delivery assembly 220. In one embodiment, heating element 270 is a tubular member and is pressed into an upper surface of gas delivery assembly 220. The upper surface of gas delivery assembly 220 includes a groove or recessed channel having a width slightly smaller than the outer diameter of heating element 270, such that heating element 270 is held within the groove using an interference fit.

Heating element 270 regulates the temperature of gas delivery assembly 220 since the components of delivery assembly 220, including gas delivery assembly 220 and blocker assembly 230 are each conductively coupled to one another. Additional details of the processing chamber may be found in U.S. Ser. No. 11/063,645, filed Feb. 22, 2005, and published as US 2005-0230350, which is incorporated by reference herein.

Processing chamber 100 is particularly useful for performing a plasma assisted dry etching process that requires heating and cooling of the substrate surface without breaking vacuum. In one embodiment, processing chamber 100 may be used to selectively remove one or more oxides on the substrate.

In one example, a dry etch process for removing one or more silicon oxides utilizes a gas mixture of ammonia ($NH_3$) and nitrogen trifluoride ($NF_3$) and may be performed within processing chamber 100. It is believed that processing chamber 100 is advantageous for any dry etch process that benefits from a plasma treatment in addition to both substrate heating and cooling all within a single processing environment, including an annealing process.

Referring to FIG. 3, the dry etch process begins by placing substrate 110 into processing chamber 100. The substrate is typically placed into chamber body 112 through slit valve opening 160 and disposed on the upper surface of support member 310. Substrate 110 may be chucked to the upper surface of support member 310. Preferably, substrate 110 is chucked to the upper surface of support member 310 by pulling a vacuum. Support member 310 is then lifted to a processing position within chamber body 112, if not already in a processing position. Chamber body 112 is preferably heated to a temperature within a range from about 50° C. to about 80° C., such as about 65° C. This temperature of chamber body 112 is maintained by passing a heat transfer medium through the channel 113.

Substrate 110 is cooled below about 65° C., such as within a range from about 15° C. to about 50° C., by passing a heat transfer medium or coolant through fluid channels formed within support assembly 300. In one embodiment, the substrate is maintained at or below room temperature. In another embodiment, the substrate is heated to a temperature within a range from about 22° C. to about 40° C. Typically, support member 310 is maintained below about 22° C. to reach the desired substrate temperature. To cool support member 310, the coolant is passed through the fluid channel formed within support assembly 300. A continuous flow of coolant is preferred to better control the temperature of support member 310. In one example, the coolant contains about 50 volume percent (vol %) of ethylene glycol and 50 vol % of water. Other ratios of water and ethylene glycol may be used so long as the substrate is maintained at a desired temperature.

An etching gas mixture is introduced to processing chamber 100 for selectively removing various oxides on a surface of substrate 110. In one embodiment, ammonia and nitrogen trifluoride gases are then introduced into processing chamber 100 to form the etching gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of chamber body 112, as well as the capabilities of the vacuum system coupled to chamber body 112.

The ratio of the etching gas mixture may be predetermined to selectively remove various oxides on the substrate surface. In one embodiment, the ratio of the gases within the etching gas mixture may be adjusted to remove various oxides, such as thermal oxides, deposited oxides, and/or native oxides. In one embodiment, the molar ratio of ammonia to nitrogen trifluoride in the etching gas mixture may be set to remove native oxides and is herein referred to as the $NH_3/NF_3$ molar ratio. In one embodiment, the gases are added to provide an etching gas mixture having at least a 1:1 molar ratio of ammonia to nitrogen trifluoride. In another embodiment, the $NH_3/NF_3$ molar ratio of the etching gas mixture is at least about 10, preferably, about 15 or greater, and more preferably, about 20 or greater, for example, about 30.

The $NH_3/NF_3$ molar ratio is proportional to the gas flow rate ratios of the ammonia and the nitrogen trifluoride. In one embodiment, the ammonia may have a flow rate into the processing chamber within a range from about 20 sccm to about 300 sccm, preferably, from about 40 sccm to about 200 sccm, more preferably, from about 60 sccm to about 150 sccm, and more preferably, from about 75 sccm to about 100 sccm. The nitrogen trifluoride may have a flow rate into the processing chamber within a range from about 1 sccm to about 60 sccm, preferably, from about 2 sccm to about 50 sccm, more preferably, from about 3 sccm to about 25 sccm, and more preferably, from about 5 sccm to about 15 sccm.

A purge gas or carrier gas may also be added to the etching gas mixture. Any suitable purge/carrier gas may be used, such as argon, helium, hydrogen, nitrogen, or mixtures thereof, for example. Typically, the overall etching gas mixture is from about 0.05% to about 20% by volume of ammonia and nitrogen trifluoride with the remainder being the carrier gas. The carrier gas may have a flow rate into the processing chamber within a range from about 200 sccm to about 5,000 sccm, preferably, from about 500 sccm to about 4,000 sccm, more preferably, from about 1,000 sccm to about 3,000 sccm. In one embodiment, the purge or carrier gas is first introduced into chamber body 112 before the reactive gases to stabilize the pressure within chamber body 112. The operating pressure within chamber body 112 may be variable. Typically, the internal pressure of chamber body 112 may be at a pressure within a range from about 500 mTorr to about 30 Torr, preferably, from about 1 Torr to about 10 Torr, and more preferably, from about 3 Torr to about 6 Torr.

An RF power may be applied to electrode 240 to ignite a plasma of the gas mixture within volumes 261, 262, and 263 contained in gas delivery assembly 220. The RF power may be within a range from about 5 watts to about 600 watts, preferably, less than about 100 watts, such as about 60 watts or less, preferably, about 50 watts or less, and more preferably, about 40 watts or less. In one embodiment, a lower RF power is utilized during the process to ignite the gas mixture and form the cleaning plasma. The RF power may be within a range from about 5 watts to about 50 watts, preferably, from about 15 watts to about 30 watts. In one example, the plasma is generated with a RF power of about 30 watts or less. In another example, the plasma is generated with a RF power of about 15 watts or less. Generally, the frequency at which the power is applied is very low, such as less than 100 kHz. Preferably, the frequency may be within a range from about 50 kHz to about 90 kHz.

The plasma energy dissociates the ammonia and nitrogen trifluoride gases into reactive species that combine to form reactive gases, such as ammonium fluoride ($NH_4F$) and/or ammonium hydrogen fluoride ($NH_4 \cdot HF_2$). This mixture of gases flow through gas delivery assembly 220 via holes 225A of gas distribution plate 225 to react with the substrate surface containing an oxide layer, such as a native silicon oxide layer. In one embodiment, the carrier gas is first introduced into a processing chamber 100, a plasma of the carrier gas is generated, and then the reactive gases, ammonia and nitrogen trifluoride, are added to the plasma.

Not wishing to be bound by theory, it is believed that the etchant gases, ammonium fluoride and/or ammonium hydrogen fluoride, react with the silicon oxide surface to form ammonium hexafluorosilicate (($NH_4)_2 SiF_6$), ammonia, and water. Gaseous ammonia and water may be removed from processing chamber 100 by vacuum pump 125. In particular, the volatile gases flow through apertures 135 formed within liner 133 into pumping channel 129 before the gases exit processing chamber 100 through vacuum port 131 into vacuum pump 125. A thin film containing ammonium hexafluorosilicate is formed on the substrate surface. This reaction mechanism may be summarized as follows:

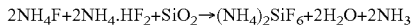

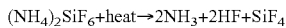

After the thin film is formed on the substrate surface, support member 310 may be elevated to an anneal position in close proximity to heated gas distribution plate 225. The heat radiated from gas distribution plate 225 may decompose or sublimate the thin film of ammonium hexafluorosilicate into volatile compounds, such as silicon tetrafluoride, ammonia, and hydrogen fluoride. These volatile products are then removed from processing chamber 100 by vacuum pump 125 as described above. Typically, the thin film may be sublimed and removed from substrate 110 at a temperature of about 75° C. or greater, preferably, about 100° C. or greater, such as within a range from about 115° C. to about 200° C.

The thermal energy to decompose the thin film of ammonium hexafluorosilicate into its volatile components is convected or radiated by gas distribution plate 225. As described above, heating element 270 is directly coupled to distribution plate 225, and is activated to heat distribution plate 225 and the components in thermal contact therewith to a temperature within a range from about 75° C. to about 300° C., preferably, from about 100° C. to about 200° C., and more preferably, from about 110° C. to about 150° C., such as about 120° C.

This elevation change may be effectuated various ways. For example, lift mechanism 330 can elevate support member 310 toward a lower surface of distribution plate 225. During this lifting step, substrate 110 is secured to support member 310, such as by the vacuum chuck or electrostatic chuck described above. Alternatively, substrate 110 may be lifted off support member 310 and placed in close proximity to heated distribution plate 225 by elevating lift pins 325 via lift ring 320.

The distance between the upper surface of substrate 110 having the thin film thereon and distribution plate 225 is not critical and is a matter of routine experimentation. A person of ordinary skill in the art can easily determine the spacing required to efficiently and effectively vaporize the thin film without damaging the underlying substrate. It is believed, however, that a spacing of between about 0.254 mm (10 mils) and 5.08 mm (200 mils) is effective.

Once the film has been removed from the substrate, processing chamber 100 is purged and evacuated. The processed substrate is then removed from chamber body 112 by lowering the substrate support 300 to the transfer position, de-chucking the substrate, and transferring the substrate through slit valve opening 160.

One embodiment of the present invention may be applied to uniformly remove various oxides during fabrication of a shallow trench isolation. STI is a primary form of device isolation technology used for sub-0.25 micron fabrication. STI fabrication generally includes trench mask and etch, sidewall oxidation, trench fill and planarization. FIGS. 4A-4I are sectional schematic views of a fabrication sequence for forming a shallow trench isolation in accordance with one embodiment of the present invention.

Figure 4A:
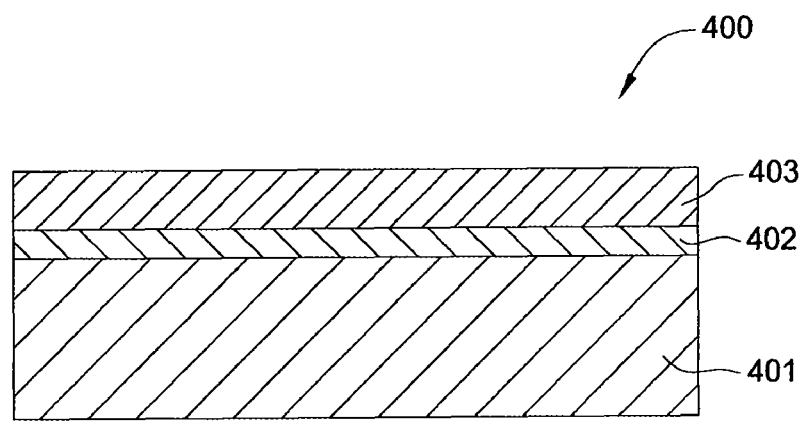
FIGS. 4A-4I depict sectional schematic views of a fabrication sequence for forming a shallow trench isolation in accordance with another embodiment described herein.

FIG. 4A illustrates semiconductor substrate 401 after barrier oxide layer 402 and deposited nitride layer 403. Substrate 401 may be a silicon substrate having a <100> crystallographic orientation and a diameter of 150 mm (6 inches), 200 mm (8 inches), or 300 mm (12 inches). The barrier oxide layer 402 may be grown on substrate 401 in a high temperature oxidation furnace. Barrier layer 402 may have a thickness of about 150 Å. Barrier oxide layer 402 protects substrate 401 from contamination during later nitride strip step. Nitride layer 403 may be formed in a high temperature low pressure chemical vapor deposition (LP-CVD) furnace. Nitride layer 403 is generally a thin layer of silicon nitride (e.g., $Si_3N_4$) formed from the reaction of ammonia and dichlorosilane gases. Nitride layer 403 is a durable masking material which protects substrate 401 during oxide deposition and serves as a polishing stop material during a later chemical mechanical planarization (CMP).

Figure 4B:
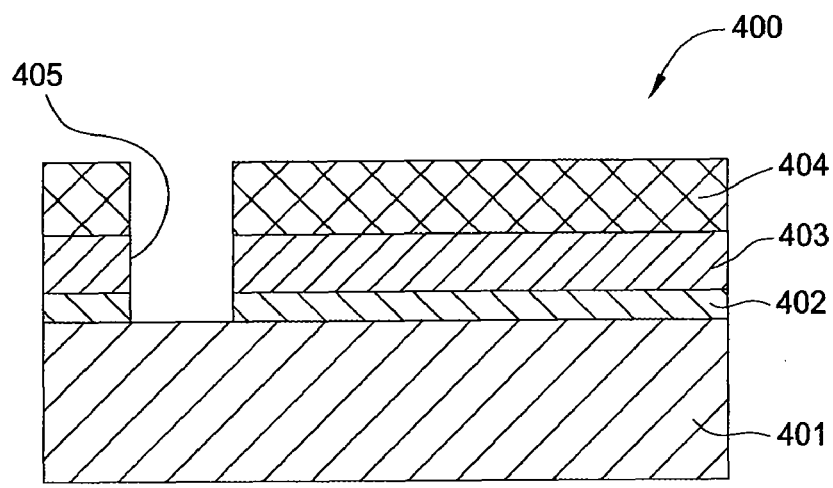

FIG. 4B illustrates photo resist layer 404 being formed, exposed and developed over nitride layer 403. A trench pattern may be formed on photo resist layer 404. Subsequent nitride etching and oxide etching steps forming a trench pattern 405 in nitride layer 403 and barrier layer 402 exposing locations designated as isolation regions in substrate 401.

Figure 4C:
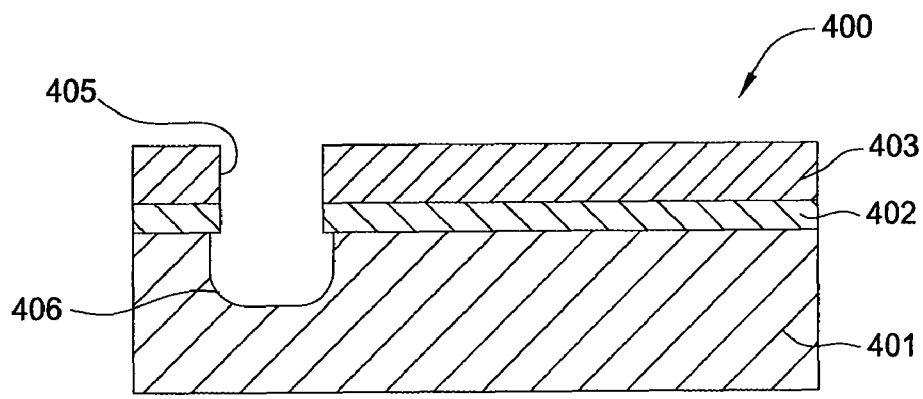

FIG. 4C illustrates shallow trench 406 is formed within substrate 401 using an etching process, such as a dry plasma etching. Shallow trench 406 will later be filled with dielectric materials and serves as insolating materials between electronic devices, such as metal on substrate field effect transistors (MOSFET), built on substrate 401.

Figure 4D:
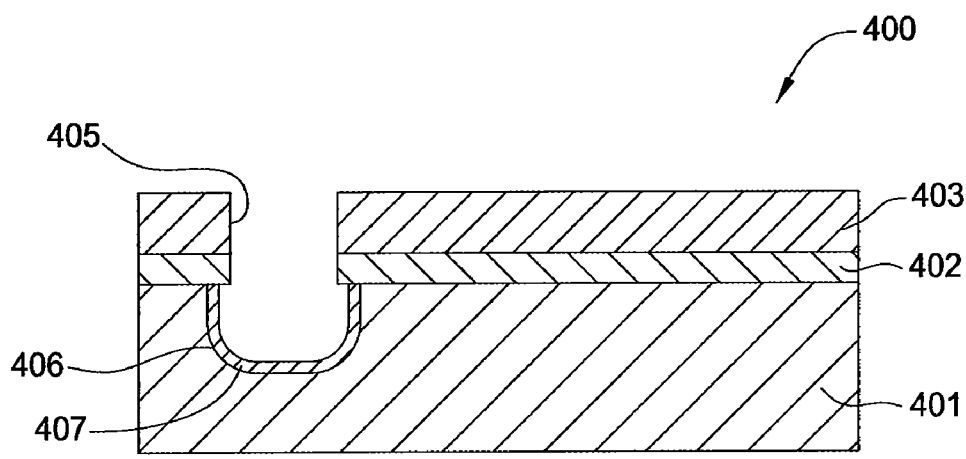

FIG. 4D illustrates liner oxide layer 407 formed inside shallow trench 406. Liner oxide layer 407 is typically grown thermally in a high temperature oxidation furnace. The purpose of liner oxide layer 407 is to improve the interface between substrate 401 and trench oxide 409—to be filled in.

Figure 4E:
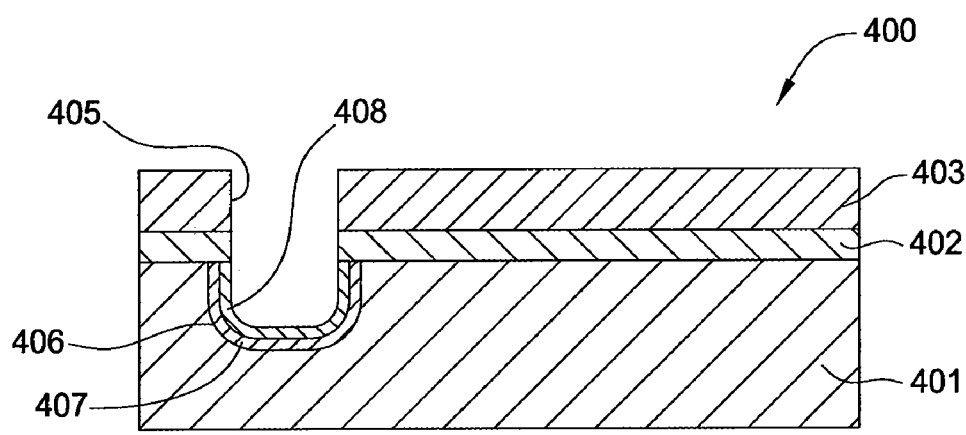

FIG. 4E illustrates nitride liner 408 formed above liner oxide layer 407 inside shallow trench 406. Nitride liner 408 may be formed by a plasma enhanced chemical vapor deposition (PE-CVD) process from silane and ammonia in a carrier gas such as nitrogen or argon. The purpose of nitride liner 408 is to induce stress in shallow trench 406 and prevent mechanical failures caused by stressed oxides.

Figure 4F:
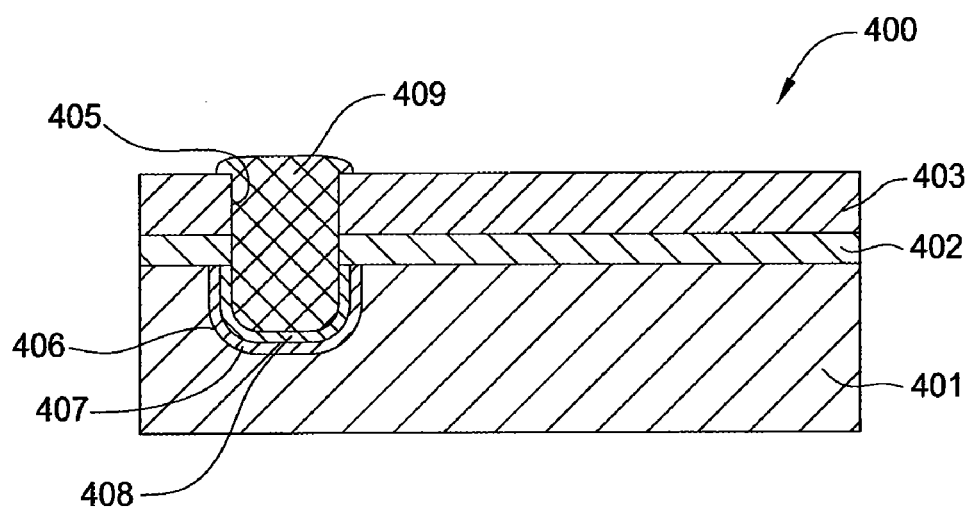

FIG. 4F illustrates trench oxide 409 filled inside shallow trench 406 and trench pattern 405. Trench oxide 409 is typically formed by a CVD process with a relatively high deposition rate. Trench oxide 409 is overfilled so that trench oxide 409 is above a top surface of substrate 401.

Figure 4G:
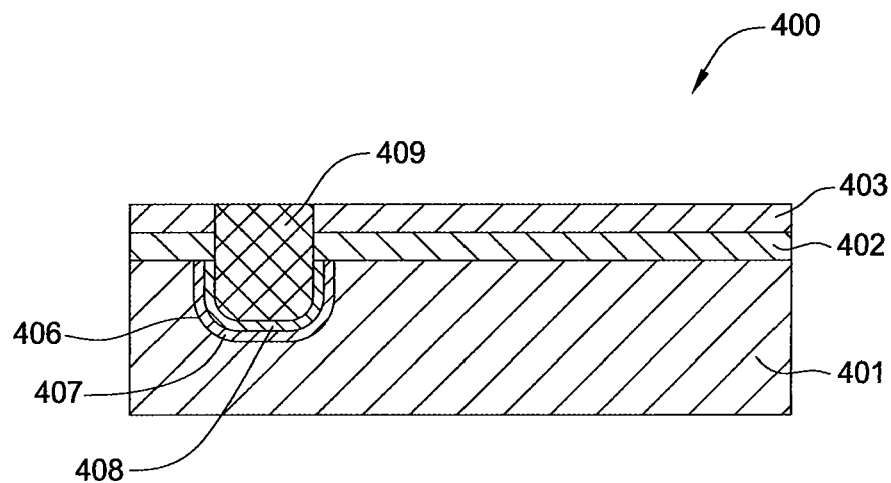

A CMP process may be applied to obtain a planar surface as shown in FIG. 4G. The CMP process removes the excess oxide from trench oxide 409.

Figure 4H:
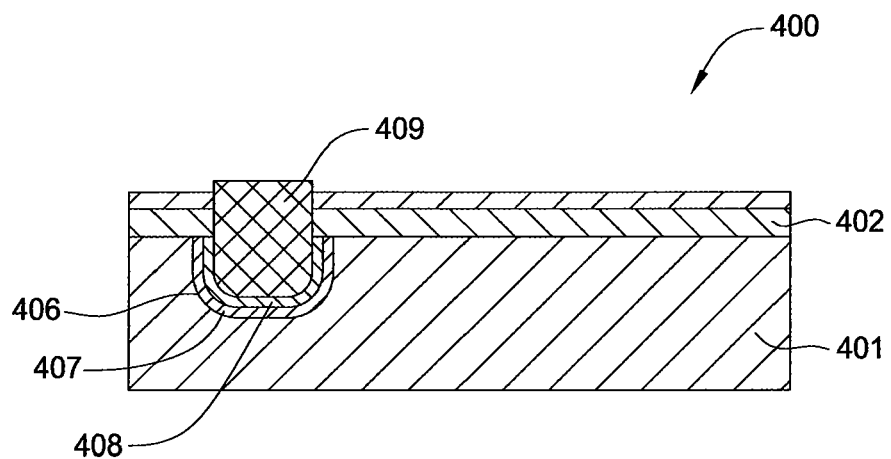

A nitride strip step may be performed to remove nitride layer 403 and expose various oxides, thermal oxide from barrier layer 402, deposited oxide from trench oxide 409, thermal oxide from liner oxide layer 407, and nitrided oxide from nitride liner 408, as shown in FIG. 4H.

Figure 4I:
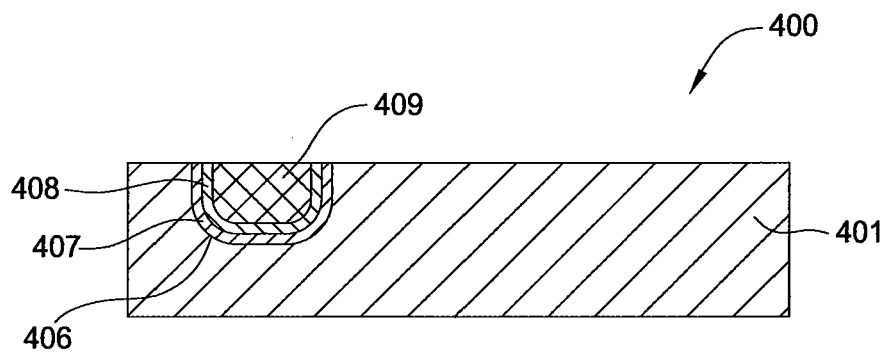

Typically, an oxide etching step will be performed to get the shallow trench structure ready for the subsequence processing step, for example, various well implants. FIG. 4I illustrates the STI after the dry etching process. A dry etching process of the present invention may be used to etch the various oxides exposed in FIG. 4H to obtain a substantially planar top surface over shallow trench 409 and prevent undesired junction and leakages. In one embodiment, the dry etch process may be preformed within a processing chamber similar to processing chamber 100. Substrate 400 may be positioned within a processing chamber and heated to a temperature of about 100° C. or less, preferably, about 80° C. or less, and more preferably, about 60° C. or less, such as within a range from about 20° C. to about 60° C., preferably, from about 25° C. to about 50° C., and more preferably, from about 30° C. to about 40° C., such as about 35° C.

An etching gas mixture is introduced to processing chamber 100 for removing the various oxides on a surface of substrate 400. In one embodiment, an etching gas mixture comprising ammonia and nitrogen trifluoride gases is introduced into the processing chamber. The amount and ratio of ammonia and nitrogen trifluoride are adjusted to accommodate, for example, the thickness of the oxide layers to be removed, the geometry of substrate 400, the volume capacity of the plasma, the volume capacity of the chamber, the capabilities of the vacuum system, as well as the properties of different oxides on substrate 400. A purge gas or carrier gas may also be added to the etching gas mixture. A plasma of the etching gas mixture is then ignited. The plasma reacts with the oxides leaving a layer of thin film containing ammonium hexafluorosilicate on substrate 400.

Subsequently, to sublimate the thin film, substrate 400 is heated to a temperature of about 100° C. or greater, such as within a range from about 100° C. to about 200° C., preferably, from about 100° C. to about 150° C., and more preferably, from about 110° C. to about 125° C. Thereafter, the processing chamber may be purged and evacuated and substrate 400 is ready for subsequence steps. In one example, the substrate is at a first temperature within a range from about 20° C. to about 80° C. during the etching process and subsequently, heated to a second temperature within a range from about 100° C. to about 150° C. during the sublimation process. In another example, the substrate is at a first temperature within a range from about 22° C. to about 40° C. during the etching process and subsequently, heated to a second temperature within a range from about 110° C. to about 125° C. during the sublimation process.

The etching process described herein may be used in various etching steps during fabrication, especially in the steps for removing one or more oxide layer. For example, various etch backs before implants and deposition may employ the etch process as described herein. In one embodiment, the etching processes described herein may be used prior to an epitaxial growth/deposition process for forming silicon-containing materials, a polysilicon deposition process, or a silicide process.

FIGS. 5A-5H illustrate sectional schematic views of a fabrication sequence for forming an electronic device, such as MOSFET structure 500, including the dry etch process and processing chamber 100 described herein. MOSFET structure 500 may be formed on a semiconductor material, for example a silicon or gallium arsenide substrate 525. Preferably, substrate 525 is a silicon wafer having a <100> crystallographic orientation and a diameter of 150 mm (6 inches), 200 mm (8 inches), or 300 mm (12 inches). Typically, MOSFET structure 500 includes a combination of (i) dielectric layers, such as silicon dioxide, organosilicate, carbon doped silicon oxide, phosphosilicate glass (PSG), borophosphosilicate glass (BPSG), silicon nitride, or combinations thereof; (ii) semiconducting layers such as doped polysilicon, and n-type or p-type doped monocrystalline silicon; and (iii) electrical contacts and interconnect lines formed from layers of metal or metal silicide, such as tungsten, tungsten silicide, titanium, titanium silicide, cobalt silicide, nickel silicide, or combinations thereof.

Figure 5A:
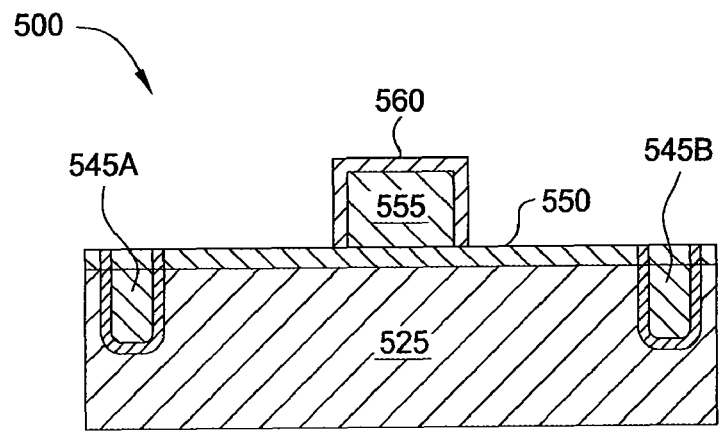
FIGS. 5A-5H depict sectional schematic views of a fabrication sequence for forming an electronic device isolated in a STI, as described in an embodiment herein.

Referring to FIG. 5A, fabrication of the active electronic device begins by forming electrical isolation structures that electrically isolate the active electronic device from other devices. There are several types of electrical isolation structures, such as field oxide barrier, or shallow trench isolation. In this case, shallow trench isolation 545A and 545B which surround exposed regions in which the electrically active elements of the device are formed and prepared. The STI may include two or more oxides as described in FIGS. 4A-4I. The exposed regions are thermally oxidized to form thin gate oxide layer 550 having a thickness within a range from about 50 Å to 300 Å. A polysilicon layer is then deposited, patterned, and etched to create polysilicon gate electrode 555. The surface of polysilicon gate electrode 555 may be re-oxidized to form an insulating dielectric layer 560, providing the structure shown in FIG. 5A.

Figure 5B:
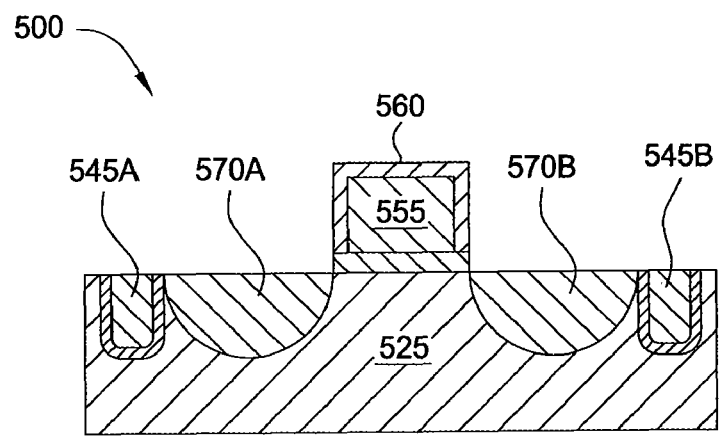

FIG. 5B depicts source 570A and drain 570B which may be formed by doping the appropriate regions with suitable dopant atoms. For example, on p-type substrates 525, an n-type dopant species comprising arsenic or phosphorous is used. Typically the doping is performed by an ion implanter and might include, for example, phosphorous at a concentration of about $10^{13}$ atoms/cm$^2$ at an energy level within a range from about 30 keV to about 80 keV, or arsenic at a dose within a range from about $1\times10^{15}$ atoms/cm$^2$ to $1\times10^{17}$ atoms/cm$^2$ and an energy level within a range from about 10 keV to about 100 keV. After the implantation process, the dopant is driven into substrate 525 by heating the substrate, for example, in a rapid thermal processing (RTP) apparatus. Thereafter, thin gate oxide layer 550 covering regions of source 570A and drain 570B is stripped by a dry etching process described above to remove any impurities caused by the implantation process which are trapped in thin gate oxide layer 550. The two or more oxides in shallow trench isolation 545A and 545B may be also be etched. The etching gas mixture may be adjusted to accommodate various etch rates needed for different oxides.

Figure 5C:
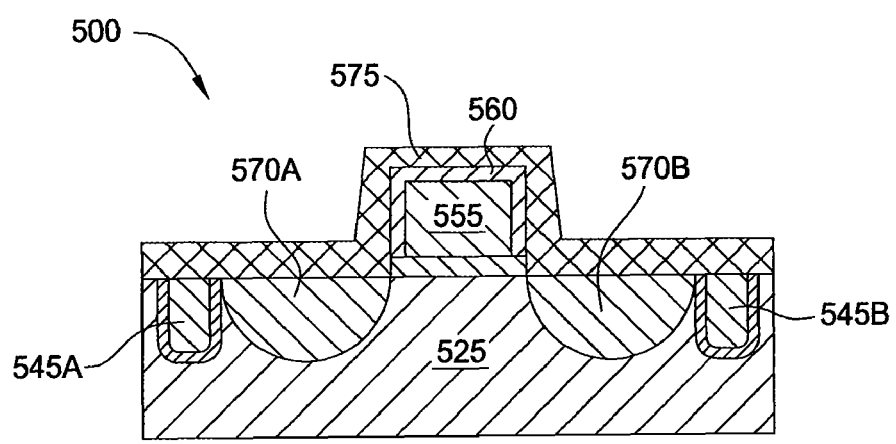
Figure 5D:
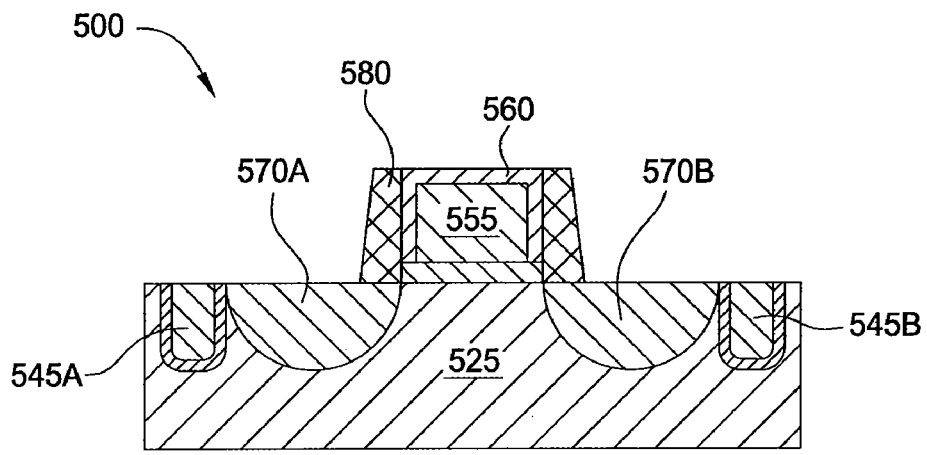

Referring to FIGS. 5C and 5D, a silicon nitride layer 575 is deposited on gate electrode 555 and the surfaces on substrate 525 by low-pressure chemical vapor deposition (LP-CVD) using a gas mixture of silane (SiH$_4$), chlorine (Cl$_2$), and ammonia (NH$_3$). The silicon nitride layer 575 is then etched using reactive ion etching (RIE) techniques to form nitride spacers 580 on the sidewall of gate electrode 555, as shown in FIG. 5D. Spacers 580 electrically isolate a silicide layer formed on the top surface of gate electrode 555 later from other silicide layers deposited over source 570A and drain 570B. It should be noted that the electrical isolation sidewall spacers 580 may be fabricated from other materials, such as silicon oxide. The silicon oxide layers used to form sidewall spacers 580 are typically deposited by CVD or PE-CVD from a feed gas of tetraethylorthosilicate (TEOS) at a temperature within a range from about 600° C. to about 1,000° C. Although, spacers 580 are shown to be formed after implantation and RTP activation, spacers 580 may be formed prior to source/drain implantation and RTP activation.

Figure 5E:
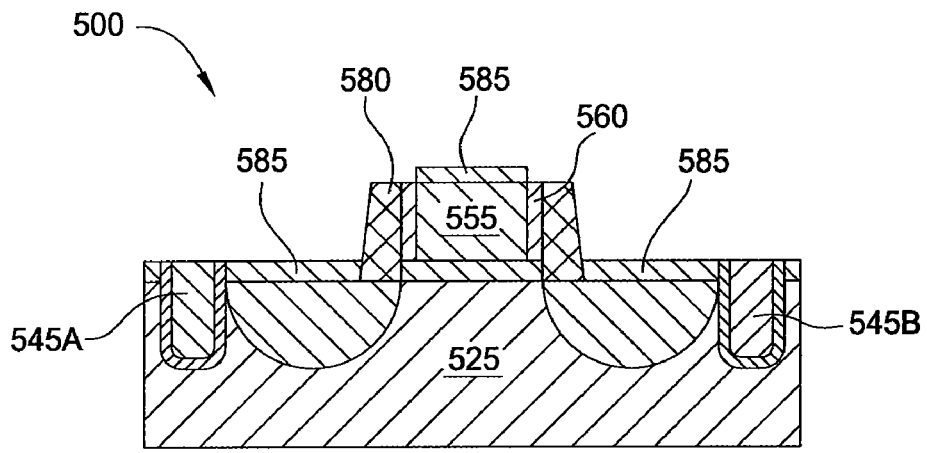
Figure 5F:
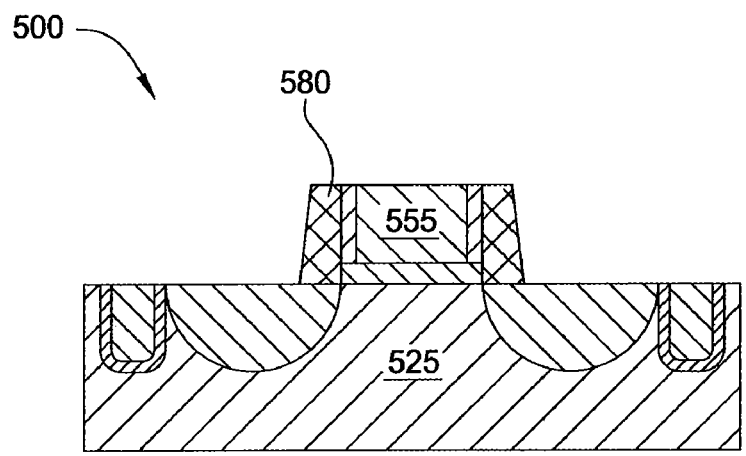

Referring to FIG. 5E, native silicon oxide layer 585 is typically formed on exposed silicon surfaces by exposure to the atmosphere before and after the processes. Native silicon oxide layer 585 must be removed prior to forming conductive metal silicide contacts on gate electrode 555, source 570A, and drain 570B to improve the alloying reaction and electrical conductivity of the formed metal silicide. Native silicon oxide layer 585 can increase the electrical resistance of the semiconducting material, and adversely affect the silicidation reaction of the silicon and metal layers that are subsequently deposited. Therefore, it is necessary to remove native silicon dioxide layer 585 using the dry etch process described prior to forming metal silicide contacts or conductors for interconnecting active electronic devices. The dry etching process described above may be used to remove native silicon oxide layer 585, to expose source 570A, drain 570B, and the top surface of gate electrode 555 as shown in FIG. 5F. The oxides in shallow trench isolation 545A and 545B are also exposed to the dray etching process. Proper adjustment, such as ratio of reactive gases, may be applied to the dry etching process to obtain a uniform removal rate at different surfaces.

Figure 5G:
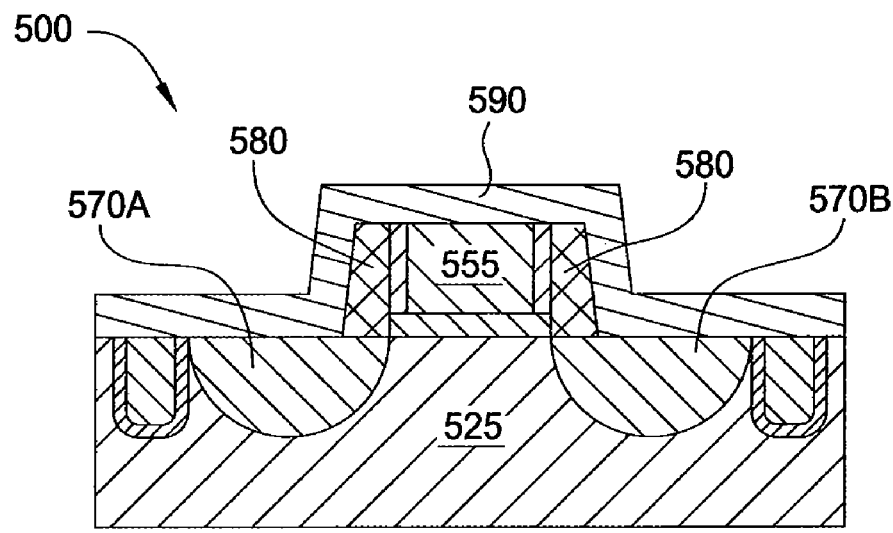

Thereafter, as illustrated in FIG. 5G, a physical vapor deposition (PVD) or sputtering process is used to deposit a layer of metal 590. Conventional furnace annealing is then used to anneal the metal and silicon layers to form metal silicide in regions in which the metal layer 590 is in contact with silicon. The annealing process is typically performed in a separate processing system. Accordingly, a protective capping layer (not shown) may be deposited over the metal 590. The capping layers are typically nitride materials and may include one or more materials selected from the group consisting of titanium nitride, tungsten nitride, tantalum nitride, hafnium nitride, silicon nitride, derivatives thereof, alloys thereof, or combinations thereof. The capping layer may be deposited by any deposition process, preferably, a PVD process.

Annealing typically involves heating the MOSFET structure 500 to a temperature of between 600° C. and 800° C. in an atmosphere of nitrogen for about 30 minutes. Alternatively, the metal silicide 595 may be formed utilizing a rapid thermal annealing process in which the MOSFET structure 500 is rapidly heated to about 1,000° C. for about 30 seconds. Suitable conductive metals include cobalt, titanium, nickel, tungsten, platinum, and other metals that have a low contact resistance and that can form a reliable metal silicide contact on both polysilicon and monocrystalline silicon.

Figure 5H:
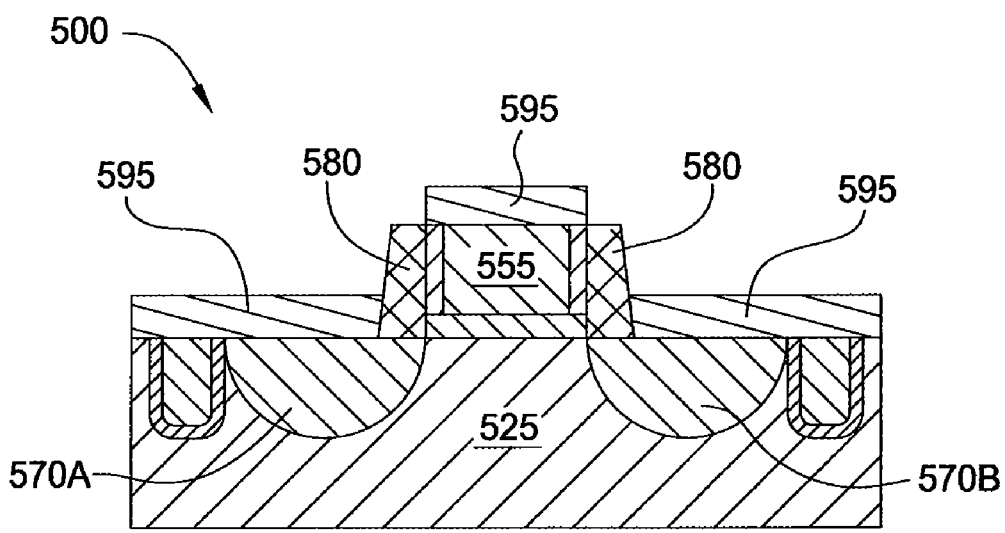

Unreacted portions of metal layer 590 may be removed by a wet etch using aqua regia, (HCl and $HNO_3$) which removes the metal without attacking metal silicide 595, spacer 580, or field oxides 545A and 545B, thus leaving a self-aligned metal silicide 595 on gate electrode 555, source 570A, and drain 570B, as shown in FIG. 5H. Thereafter, an insulating cover layer comprising, for example, silicon oxide, BPSG, or PSG, may be deposited on the electrode structures. The insulating cover layer is deposited by means of chemical-vapor deposition in a CVD chamber, in which the material condenses from a feed gas at low or atmospheric pressure, for example, as described in commonly assigned U.S. Pat. No. 5,500,249, which is incorporated herein by reference. Thereafter, MOSFET structure 500 is annealed at glass transition temperatures to form a smooth planarized surface.

Although the process sequence above has been described in relation to the formation of a MOSFET device, the dry etching process described herein can also be used to form other semiconductor structures and devices that require removal of various oxides. The dry etching process can also be used prior to the deposition of layers of different metals including, for example, aluminum, copper, cobalt, nickel, silicon, titanium, palladium, hafnium, boron, tungsten, tantalum, alloys thereof, or combinations thereof.

In one embodiment, the dry etching process as described in embodiments here may be combined with an aqueous etching process. For example, for an oxide structure having at least two oxides, a dry etching process may be used to selectively remove a first oxide, either completely or partially reduce the first oxide feature relative to a second oxide. An aqueous HF etching process may be followed to remove the second oxide.

To provide a better understanding of the foregoing discussion, the following non-limiting example is offered. Although the example may be directed to specific embodiments, the example should not be interpreted as limiting the invention in any specific respect.

EXAMPLES

Figure 6:
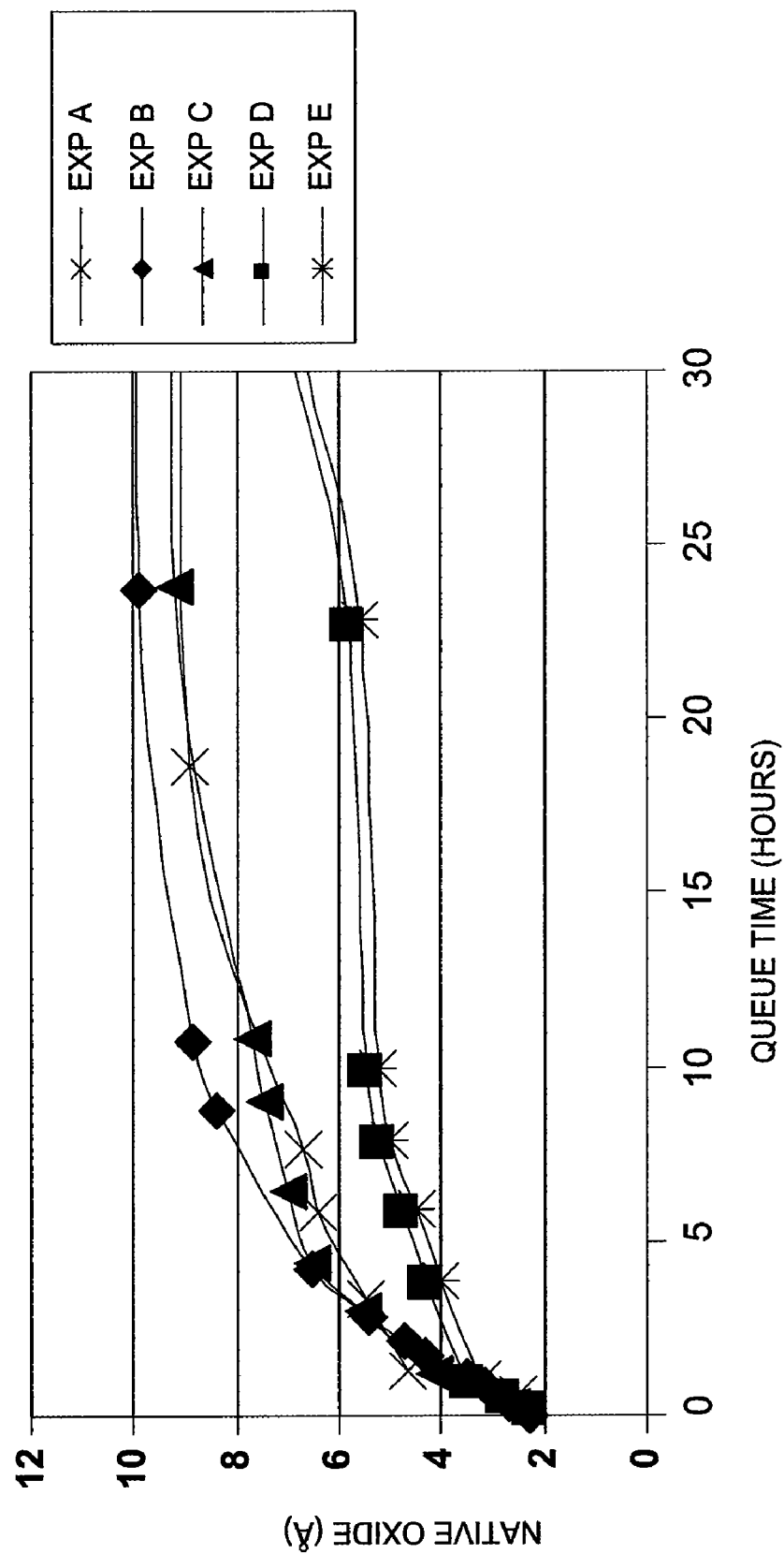
FIG. 6 shows a graph depicting oxide growth rates on various passivated substrate surfaces, as described in some embodiments herein.

Substrates were exposed to various etching processes to remove native oxide layers and to form passivated surfaces thereon. Subsequently, the substrates were exposed to ambient conditions during a queue time and a secondary native oxide layer formed on the passivated surfaces. The thickness of these secondary native oxide layers were monitored with respect to the queue time while being exposed to ambient conditions, as graphically illustrated in FIG. 6. The various etching processes included Experiments A-E, as summarized in the chart below.

| Substrate | $NH_3$ flow rate (sccm) | $NF_3$ flow rate (sccm) | $NH_3/NF_3$ molar ratio | Plasma power (W) |
|---|---|---|---|---|
| A | — | — | — | — |
| B | 70 | 14 | 5 | 30 |
| C | 100 | 50 | 2 | 30 |
| D | 100 | 5 | 20 | 30 |
| E | 100 | 5 | 20 | 15 |

In Experiment A, Substrate A was exposed to a HF wet clean solution and process. Substrates B and C, in Experiments B and C, were exposed to a mixture of etching gases having a $NH_3/NF_3$ molar ratio of about 5 and about 2, respectively, and were both exposed to a plasma ignited with a RF power of about 30 watts. Substrates D and E, in Experiments D and E, were both exposed to a mixture of etching gases having a $NH_3/NF_3$ molar ratio of about 20, but were exposed to plasmas ignited with different RF powers of about 30 watts and 15 watts, respectively.

Along with the ammonia and nitrogen trifluoride gases, argon was also introduced into the processing chamber having a flow rate of about 3,500 sccm for Experiments B-E. The internal pressure of the processing chamber was at about 3 Torr and the substrate temperature was about 35° C. The substrate was etched for 120 seconds to form a film containing ammonium hexafluorosilicate.

During the subsequent annealing process, the spacing between the substrate surface and the showerhead was about 750 mils. A pedestal purge of argon with a flow rate of about 1,500 sccm and an edge purge of argon with a flow rate of about 500 sccm within the processing chamber. The lid temperature was heated to about 120° C. and the substrate was annealed for about 60 seconds to remove the film by sublimation and/or decomposition while passivating the substrate surface. About 50 Å of material containing silicon native oxide was removed from each substrate surface.

Once the etching process was complete for Experiments A-E, Substrates A-E were removed from the processing chamber and positioned within the ambient environment, such that the substrates were exposed to the oxygen and water within the air at room temperature (about 22° C.). After a queue time of about 5 hours, Substrates A, B, and C each contained an oxide layer of greater than about 5 Å, while Substrates D and E each contained an oxide layer of less than about 5 Å. After a queue time of about 10 hours, Substrates A, B, and C each contained an oxide layer of greater than about 7 Å, while Substrates D and E each contained an oxide layer of less than about 6 Å. After queue times of about 15 hours, 20 hours, and 25 hours, Substrates A, B, and C each contained an oxide layer of greater than about 8 Å, while Substrates D and E each contained an oxide layer of less than about 6 Å. Also, after a queue time of about 30 hours, Substrates A, B, and C each contained an oxide layer of about 9 Å or greater, while Substrates D and E each contained an oxide layer of less than about 7 Å.

Therefore, the passivation surface formed during Experiments D and E limits further formation of another native oxide layer on the substrate to a thickness of about 6 Å or less during a queue time period within a range from about 5 hours to about 25 hours while being exposed to ambient conditions outside the processing chamber. Additionally, the passivation surface formed during Experiments D and E limits further formation of another native oxide layer on the substrate to a thickness of about 8 Å or less, preferably, about 7 Å or less, and more preferably, about 6 Å or less, during a time period within a range from about 15 hours to about 30 hours while being exposed to ambient conditions outside the processing chamber.

Unless otherwise indicated, all numbers expressing quantities of properties, reaction conditions, used in the specification and claims are to be understood as approximations. These approximations are based on the desired properties sought to be obtained by the invention, and the error of measurement, and should at least be construed in light of the number of reported significant digits and by applying ordinary rounding techniques. Further, any of the quantities expressed herein, including temperature, pressure, spacing, molar ratios, flow rates, may be further optimized to achieve the desired etch selectivity and performance.

While the foregoing is directed to embodiments of the invention, other and further embodiments of the invention may be devised without departing from the basic scope thereof, and the scope thereof is determined by the claims that follow.

The invention claimed is:

1. A method for removing native oxides from a substrate surface, comprising:
   positioning a substrate comprising an oxide layer within a processing chamber;
   adjusting a first temperature of the substrate to about 80° C. or less;
   generating a cleaning plasma from a gas mixture within the processing chamber, wherein the gas mixture comprises ammonia and nitrogen trifluoride having an $NH_3/NF_3$ molar ratio of about 10 or greater;
   condensing the cleaning plasma onto the substrate and forming a thin film during a plasma clean process, wherein the thin film comprises ammonium hexafluorosilicate formed in part from the oxide layer; and
   heating the substrate to a second temperature within a range from about 100° C. to about 200° C. within the processing chamber at an operating pressure within a range from about 500 mTorr to about 30 Torr while removing the thin film from the substrate and while forming a passivation surface thereon.

2. The method of claim 1, wherein the $NH_3/NF_3$ molar ratio is about 20 or greater.

3. The method of claim 2, wherein the cleaning plasma is generated with a RF power within a range from about 5 watts to about 50 watts.

4. The method of claim 3, wherein the RF power is within a range from about 15 watts to about 30 watts.

5. The method of claim 1, wherein the gas mixture is formed by combining the ammonia having a flow rate within a range from about 40 sccm to about 200 sccm and the nitrogen trifluoride having a flow rate within a range from about 2 sccm to about 50 sccm.

6. The method of claim 5, wherein the ammonia has a flow rate within a range from about 75 sccm to about 100 sccm and nitrogen trifluoride has a flow rate within a range from about 5 sccm to about 15 sccm.

7. The method of claim 1, wherein the first temperature is within a range from about 20° C. to about 80° C.

8. The method of claim 7, wherein the first temperature is within a range from about 22° C. to about 40° C. and the second temperature is within a range from about 110° C. to about 150° C.

9. The method of claim 1, further comprising growing an epitaxial layer on the passivation surface of the substrate.

10. The method of claim 1, wherein the passivation surface limits further formation of another native oxide layer on the substrate to a thickness of about 6 Å or less during a time period within a range from about 5 hours to about 25 hours while the substrate is exposed to ambient conditions outside the processing chamber.

11. The method of claim 1, wherein the passivation surface limits further formation of another native oxide layer on the substrate to a thickness of about 8 Å or less during a time period within a range from about 15 hours to about 30 hours while the substrate is exposed to ambient conditions outside the processing chamber.

12. A method for removing native oxides from a substrate surface, comprising:
   positioning a substrate comprising an oxide layer within a processing chamber;
   adjusting a first temperature of the substrate to less than about 100° C.;
   generating a cleaning plasma from a gas mixture within the processing chamber, wherein the gas mixture comprises ammonia and nitrogen trifluoride having an $NH_3/NF_3$ molar ratio of about 20 or greater and the cleaning plasma is generated by a RF power within a range from about 5 watts to about 50 watts;
   exposing the substrate to the cleaning plasma to form a thin film during a plasma clean process, wherein the thin film comprises ammonium hexafluorosilicate formed in part from the oxide layer; and
   heating the substrate to a second temperature within a range from about 100° C. to about 200° C. within the processing chamber at an operating pressure within a range from about 500 mTorr to about 30 Torr while removing the thin film from the substrate and while forming a passivation surface thereon.

13. The method of claim 12, wherein the RF power is within a range from about 15 watts to about 30 watts.

14. The method of claim 12, wherein the gas mixture is formed by combining the ammonia having a flow rate within a range from about 1 sccm to about 10 sccm and the nitrogen trifluoride having a flow rate within a range from about 50 sccm to about 200 sccm.

15. The method of claim 14, wherein the ammonia has a flow rate within a range from about 2 sccm to about 8 sccm and nitrogen trifluoride has a flow rate within a range from about 75 sccm to about 150 sccm.

16. The method of claim 12, wherein the first temperature is within a range from about 20° C. to about 80° C.

17. The method of claim 16, wherein the first temperature is within a range from about 22° C. to about 40° C. and the second temperature is within a range from about 110° C. to about 150° C.

18. The method of claim 12, further comprising growing an epitaxial layer on the passivation surface of the substrate.

19. The method of claim 12, wherein the passivation surface limits further formation of another native oxide layer on the substrate to a thickness of about 6 Å or less during a time period within a range from about 5 hours to about 25 hours while the substrate is exposed to ambient conditions outside the processing chamber.

20. A method for removing native oxides from a substrate surface, comprising:
    positioning a substrate comprising an oxide layer within a processing chamber;
    adjusting a first temperature of the substrate to less than about 100° C.;
    generating a cleaning plasma from a gas mixture within the processing chamber, wherein the gas mixture comprises ammonia and nitrogen trifluoride having an $NH_3/NF_3$ molar ratio of about 10 or greater and the cleaning plasma is generated by a RF power within a range from about 5 watts to about 50 watts;
    exposing the substrate to the cleaning plasma to form a thin film during a plasma clean process, wherein the thin film comprises ammonium hexafluorosilicate formed in part from the oxide layer;
    heating the substrate to a second temperature within a range from about 100° C. to about 200° C. within the processing chamber at an operating pressure within a range from about 500 mTorr to about 30 Torr while removing the thin film from the substrate and while forming a passivation surface thereon; and
    growing an epitaxial layer on the passivation surface of the substrate.

21. The method of claim 20, wherein the first temperature is within a range from about 15° C. to about 50° C., and the second temperature is within a range from about 110° C. to about 150° C.

22. The method of claim 21, wherein the operating pressure within the processing chamber is maintained within a range from about 500 mTorr to about 30 Torr while adjusting the first temperature, generating the cleaning plasma, exposing the substrate to the cleaning plasma, and heating the substrate to a second temperature.

23. The method of claim 20, wherein the operating pressure is within a range from about 3 Torr to about 6 Torr.

24. The method of claim 20, wherein the gas mixture further comprises a carrier gas selected from the group consisting of argon, helium, hydrogen and nitrogen, and the gas mixture is delivered to the processing chamber at a flow rate within a range from about 1,000 sccm to about 3,000 sccm.

* * * * *

UNITED STATES PATENT AND TRADEMARK OFFICE
CERTIFICATE OF CORRECTION

PATENT NO. : 7,780,793 B2
APPLICATION NO. : 11/962791
DATED : August 24, 2010
INVENTOR(S) : Yang et al.

It is certified that error appears in the above-identified patent and that said Letters Patent is hereby corrected as shown below:

In the Detailed Description:

Column 9, Line 1, please delete "$(NH_4.HF_2)$" and insert --$(NH_4 \cdot HF_2)$-- therefor;

Column 9, Line 21, please delete "$NF_3+_{xss}NH_3 \rightarrow NH_4F+NH_4.HF_2+N_2$" and insert --$NF_3+xsNH_3 \rightarrow NH_4F+NH_4 \cdot HF_2+N_2$--;

Column 9, Line 23, please delete "$2NH_4F+2NH_4.HF_2+SiO_2 \rightarrow (NH_4)_2SiF_6+2H_2O+2NH_3$" and insert --$2NH_4F+2NH_4 \cdot HF_2+SiO_2 \rightarrow (NH_4)_2SiF_6+2H_2O+2NH_3$-- therefor.

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,780,793 B2  
APPLICATION NO. : 11/962791  
DATED : August 24, 2010  
INVENTOR(S) : Yang et al.

Page 1 of 1

It is certified that error appears in the above-identified patent and that said Letters Patent is hereby corrected as shown below:

In the Detailed Description:

Column 9, Line 1, please delete "($NH_4.HF_2$)" and insert --($NH_4 \cdot HF_2$)-- therefor;

Column 9, Line 21, please delete "$NF_3+xsNH_3 \rightarrow NH_4F+NH_4.HF_2+N_2$" and insert --$NF_3+xsNH_3 \rightarrow NH_4F+NH_4 \cdot HF_2+N_2$-- therefor;

Column 9, Line 23, please delete "$2NH_4F+2NH_4.HF_2+SiO_2 \rightarrow (NH_4)_2SiF_6+2H_2O+2NH_3$" and insert --$2NH_4F+2NH_4 \cdot HF_2+SiO_2 \rightarrow (NH_4)_2SiF_6+2H_2O+2NH_3$-- therefor.

This certificate supersedes the Certificate of Correction issued December 14, 2010.

Signed and Sealed this  
First Day of March, 2011

David J. Kappos  
*Director of the United States Patent and Trademark Office*